US006957480B2

(12) United States Patent
Giunchi et al.

(10) Patent No.: US 6,957,480 B2
(45) Date of Patent: Oct. 25, 2005

(54) METHOD FOR THE PRODUCTION OF SUPERCONDUCTIVE WIRES BASED ON HOLLOW FILAMENTS MADE OF MGB$_2$

(75) Inventors: Giovanni Giunchi, Milan (IT); Sergio Ceresara, Lucca (IT)

(73) Assignee: Edison S.p.A.., Milan (IT)

( * ) Notice: Subject to any disclaimer, the term of this patent is extended or adjusted under 35 U.S.C. 154(b) by 67 days.

(21) Appl. No.: 10/429,193

(22) Filed: May 2, 2003

(65) Prior Publication Data
US 2004/0009879 A1 Jan. 15, 2004

(30) Foreign Application Priority Data
May 10, 2002 (IT) ................................. MI2002A1004

(51) Int. Cl.$^7$ ............................................. H01L 39/24
(52) U.S. Cl. ...................... 29/599; 505/230; 505/232; 505/704
(58) Field of Search .......................... 29/599; 505/230, 505/232, 704

(56) References Cited

U.S. PATENT DOCUMENTS

| | | | |
|---|---|---|---|
| 6,511,943 B1 * | 1/2003 | Serquis et al. | 505/300 |
| 6,586,370 B1 * | 7/2003 | Holcomb | 505/236 |
| 6,687,975 B2 * | 2/2004 | Tomsic | 29/599 |

FOREIGN PATENT DOCUMENTS

| | | | |
|---|---|---|---|
| EP | 1396866 A1 | * | 3/2004 |
| JP | 2002-222619 | * | 8/2002 |
| JP | 2002-373534 | * | 12/2002 |
| JP | 2003-037303 | * | 2/2003 |
| JP | 2003-123556 | * | 4/2003 |
| WO | 02/103716 A1 | * | 12/2002 |
| WO | 03/005460 A2 | * | 1/2003 |

OTHER PUBLICATIONS

Supertcvonductor in Dense MgB2 Wires, by P.C. Canfield et al , Phys Rev Letters, vol. 86, No. 11, pp 2423–26, , Mar. 2001.*

* cited by examiner

Primary Examiner—Carl J. Arbes
(74) Attorney, Agent, or Firm—Hedman & Costigan P.C

(57) ABSTRACT

A method is described for the production of superconductive wires based on hollow filaments made of MgB$_2$, which comprises: a) the formation of a composite billet by means of the coaxial insertion in a tubular metallic container of a cylindrical bar made of metallic magnesium and amorphous boron powder in the interspace between the container and bar, said powder being pressed between the metallic container and the magnesium bar, in such a quantity that the weight ratio magnesium/boron is higher than 1.2; b) at least one plastic deformation treatment of the composite billet thus obtained until a wire with a pre-fixed diameter is obtained, with the subsequent winding of the wire onto a support; c) a thermal treatment of the filament product thus obtained, at a temperature ranging from 700° C. to 950° C. for a time ranging from 15 minutes to three hours.

23 Claims, 3 Drawing Sheets

Figure 1:
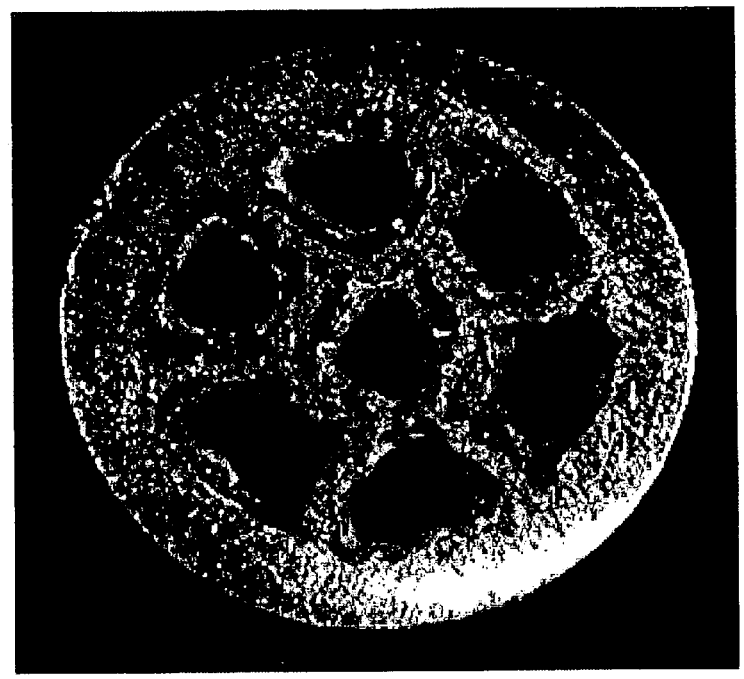

METHOD FOR THE PRODUCTION OF SUPERCONDUCTIVE WIRES BASED ON HOLLOW FILAMENTS MADE OF MGB$_2$

The present invention relates to a method for the production of superconductive wires based on hollow filaments made of MgB$_2$.

As it is known, magnesium boride has superconductive properties up to 39 K and can therefore be applied in closed circuit cryogenic systems (cryo-refrigerators), which are less expensive than those based on the use of liquid helium.

Furthermore many superconductive power applications are extremely jeopardized by the use of cooling systems based on liquid He and there is consequently great interest in identifying superconductive materials which can be used at temperatures higher than 4.2 K and preferably higher than 10 K, a range within which other more economical cooling systems operate.

For magnesium boride to have improved superconductivity properties and improved mechanical properties, however, it is fundamental to obtain a magnesium boride end-product densified up to values close to the theoretical density value (2.63 g/cm$^3$) and this is only possible according to the known methods in the state of the art by the use of high pressures at high temperatures, which however limits the dimensions of the end-products produced and requires the use of equipment which is unsuitable for mass production.

The application of high pressures at a high temperature, moreover, is even more difficult when hollow superconductive wires based on MgB$_2$ are desired.

According to the state of the art, the production of superconductive wires based on MgB$_2$ is mainly effected by means of the "Powder in Tube" technology, in its two main variants.

The first variant comprises the drawing of a metallic sheath containing MgB$_2$ powders, whereas in the second variant the metallic sheath contains mixtures of boron and magnesium powders. Suitable thermal treatment, optionally also at high pressures, is applied to these composite sheaths, after the drawing and/or lamination, in order to obtain one or more filament conductors made of sintered MgB$_2$, inside the sheath.

In both variants of the above process according to the state of the art, it is essential for the thermal treatment to be effected with the application of high pressures. If the resulting fibres, in fact, are produced without the application of high pressures during the thermal treatment, there are the following disadvantages: they transport electric currents with low density values in the presence of high magnetic fields and at temperatures higher than 4.2 K (boiling point of liquid He): this is mainly due to the low density of the sintered material and/or to the insufficient cohesion of the crystalline grains.

In the first variant, in fact, the high temperature sintering of MgB$_2$ powders is strongly limited by the decomposition process of the MgB$_2$ crystals which, at atmospheric pressure or under vacuum, already begins at intermediate temperatures, i.e. at temperatures in the order of 400° C.

In the second variant, the magnesium and boron powders, which have reacted at a high temperature and without pressure, are transformed into MgB$_2$, but the corresponding sintered material is porous, as the initial space occupied by the magnesium powders is only partially occupied by the MgB$_2$ crystals which are formed. Sintering technologies assisted by outside pressure, on the other hand, such as hot isostatic pressing or hot uni-axial pressing, are not particularly compatible with an industrial production of long wires.

An objective of the present invention is therefore to obtain superconductive wires, based on hollow filaments made of MgB$_2$, highly densified, and arranged in adjacent circular crowns inside a metallic sheath containing it, with a method which overcomes the drawbacks present in the known art.

An object of the present invention relates to a method for the production of superconductive wires based on hollow filaments made of MgB$_2$, which comprises:

a) the formation of a composite billet by means of the coaxial insertion in a tubular metallic container of a cylindrical bar made of metallic magnesium and amorphous boron powder, in the interspace between the container and bar, said powder being pressed between the metallic container and the magnesium bar, in such a quantity that the weight ratio magnesium/boron is higher than 1.2;

b) at least one plastic deformation treatment of the composite billet thus obtained until a wire with a prefixed diameter is obtained, with the subsequent winding of the wire onto a support;

c) a thermal treatment of the filament product thus obtained, at a temperature ranging from 700° C. to 950° C. for a time ranging from 15 minutes to three hours.

In particular, when superconductive wires based on hollow monofilaments made of MgB$_2$ are to be obtained, phase a) for the formation of a composite billet comprises, as indicated above, the coaxial insertion in a tubular metallic container of a cylindrical bar made of metallic magnesium and, in the interspace between the container and bar, the insertion of amorphous boron powder, said powder being pressed between the metallic container and the magnesium bar, in such a quantity that the weight ratio magnesium/boron is higher than 1.2.

The method according to the present invention can also contemplate, in phase a), the coaxial insertion of a niobium sheath, adjacent to the tubular metallic container.

In particular, when superconductive wires based on hollow multifilaments made of MgB$_2$ are desired, the method according to the present invention comprises: phase a) for the formation of a composite billet which comprises the coaxial insertion in a tubular metallic container of a niobium sheath and a cylindrical bar made of metallic magnesium and, in the interspace between the internal wall of the Nb sheath and Mg bar, the insertion of amorphous boron powder, said powder being pressed between the metallic container and the magnesium bar, in such a quantity that the weight ratio magnesium/boron is higher than 1.2;

phase b) and, before the thermal treatment c), the following further phases are added:

b1) possible removal by means of chemical or mechanical treatment of the external metallic container of the filament end-product, until the niobium sheath is completely exposed;

b2) cutting of the filament end-product and its assembly in a further tubular metallic container, with a hexagonal arrangement, of a series of composite wires coming from the cutting process;

b3) at least one plastic deformation treatment of the tubular container containing the composite multifilaments thus obtained, until a wire with a prefixed diameter is obtained;

b4) winding of the wire.

Furthermore, in phase b), the plastic deformation treatment of the composite billet thus obtained, and/or in phase b3) the plastic deformation treatment of the tubular container containing the composite multifilaments thus obtained, can be such that series of singles deformation passages are alternated with a thermal treatment of 5 to 20 minutes at temperatures ranging from 300° C. to 500° C.

In particular, the thermal treatment c) can be effected according to one of the following procedures:

c1) static thermal treatment in a chamber oven, after sealing the ends of the wire in an atmosphere with a low oxygen content, thus generating inside, at a high temperature, a pressure of magnesium vapours higher than atmospheric pressure; or c2) dynamic thermal treatment, by passing the wire continuously through an open tubular oven, containing inside an atmosphere poor in oxygen.

In the method according to the present invention, it is also possible for the tubular metallic container of phase a) to consist of several different metallic sheaths.

A further object of the present invention relates to a superconductor based on a hollow monofilament or multifilament made of $MgB_2$, which can be obtained by means of the method according to any of the previous claims.

The present invention also relates to the use of superconductor wires based on hollow filaments of $MgB_2$ obtained with the method according to the present invention, by the thermal treatment described in c1), or in c2), to form superconductor end-products, such as coils for magnets or components of electro-technical equipment, such as coils for engines, generators, transformers, current limiters, magnet energy accumulators, electromagnetic screens.

For these purposes, the coils have a minimum curvature radius of the filament which is higher than a threshold value which prevents damage to the magnesium boride filaments present inside the metallic sheath.

Furthermore, the superconductor wire which can be obtained with the method according to the present invention, by means of the thermal treatment described in C2), can also be used for end-products such as stranded wires or other types of superconductive filiform end-products suitable for conveying electric currents.

Phase b1) for the removal of the external metallic container, exposing the Nb sheath, can be effected by means of chemical treatment, in particular by means of acid dissolution, or by mechanical treatment, in particular by means of abrasion.

A first embodiment of the method according to the present invention allows the production of a superconductor wire based on a hollow monofilament of $MgB_2$, with a single central empty zone.

At the end of the thermal treatment, the magnesium and boron have reacted to produce highly densified $MgB_2$, positioned on the internal wall of the metallic sheath, having a hollow area in the centre, only partially filled by possible excess residual magnesium.

Alternatively, for superconductor end-products which require windings having a curvature radius lower than the threshold value of damage to the hollow $MgB_2$ filament, the method contemplating the thermal treatment c1) is used. In this way, superconductive coils are also obtained for magnets or for components of electro-technical equipment, such as for example coils for engines, generators, transformers, current limiters, magnetic energy accumulators, electromagnetic screens.

In order to guarantee the stabilization of the superconductor filament, in the case of the sudden loss of the superconductive characteristics (quenching), various technologies described in the known art, can be applied, such as for example, covering or englobement of the wire or coil already having superconductive properties, by means of highly thermoconductive metals and contemporaneously with a low electric resistivity (such as Cu, Al, Ag, etc.).

Should the diameter of the hollow areas inside the superconductor filament be sufficiently large as to allow the passage of cooling fluid inside the cavities, the stabilizing action of the coolant itself in contact with the superconductor, can be used.

The basic advantage of the method according to the present invention consists in the fact that it allows the production of superconductor wires based on hollow filaments of $MgB_2$, specifically characterized in that the $MgB_2$ filaments have an internal area without superconductor material, which show superconductor characteristics with high density values of critical current in a magnetic field, also at temperatures higher than 10 K, higher with respect to the data published for the $MgB_2$ filaments obtained with the methods of the known art.

A further advantage of the hollow superconductor filament according to the present invention consists in the fact that the presence of hollow areas inside the superconductor filament can be exploited for the passage of cooling fluid and consequently for a more direct cooling.

The characteristics and advantages of the method according to the present invention will appear more evident from the following detailed and illustrative description.

In particular, in an embodiment of the method according to the present invention, the method for the production of superconductor wires based on hollow filaments made of $MgB_2$ comprises the formation of a composite billet obtained first of all by the insertion of a niobium sheath inside a tubular metallic container.

The tubular metallic container preferably consists of steel with a low carbon content, i.e. with a carbon content lower than 0.2% by weight, or of Cu or one of its alloys containing Ni, or different layers of the above metals.

The Nb sheath consists of a tube or sheet rolled up several times. The total thickness, s, of the Nb sheath is typically linked to the internal diameter of the metallic container, $d_c$, according to the following relation:

$$0.01*d_c<s<0.05*d_c$$

and preferably according to the following relation:

$$0.020*d_c<s<0.035*d_c.$$

A metallic magnesium bar is then coaxially inserted inside the Nb sheath, said bar being a solid cylindrical bar made of pure magnesium (>99%), with a diameter $d_{Mg}$, typically within the following range:

$$0.5*(d_c-2s)<d_{Mg}<0.8*(d_c-2s)$$

and preferably within the range $$0.6*(d_c-2s) \text{ and } 0.7*(d_c-2s).$$

Amorphous boron powder is then inserted in the interspace between the inner wall of the Nb sheath and the Mg bar. The non-crystalline boron powder has a purity higher than or equal to 95% (excluding the possible presence of metallic Mg) and a particle-size with an average diameter of less than 20 micrometers, preferably less than 10 micrometers.

The quantity of boron powder which can be inserted in the interspace is at least that corresponding to a vertical gravitational filling, assisted by vibrations and manual pressure applied with a tube to be inserted in the interspace, thus obtaining a weight ratio between Mg and B preferably ranging from 1.20 to 1.60.

The composite billet thus obtained undergoes one or more treatment cycles or plastic deformation processes, typically represented by extrusion, drawing, swaging, wire-rod rolling, with the possible intercalation of a series of single deformation passages with thermal treatment lasting from 5 to 20 minutes at temperatures ranging from 300° C. to 500° C., to produce a continuous filament end-product, whose length is determined by the reduction ratio between the diameter of the initial billet and the diameter of the final wire and compatible with the absence of structural defects on the wire which may occur if the ductility of the materials forming the billet is not sufficient for resisting typical metallurgical plastic processings.

The filament end-product thus obtained can be subsequently chemically treated with acids, such as with a mixture of $HCl/HNO_3$ (50/50) in the case of iron-based containers. By suitably protecting the heads of the end-product from acid attack, these mixtures allow the external metallic container to dissolve without dissolving the Nb sheath.

The filament end-product resulting after the acid attack consists of the Nb sheath, including Mg and B; it is then subdivided into parts having a length suitable for being assembled in a hexagonal arrangement, according to a series of wires which homogeneously fill a new tubular metallic container, having an internal diameter sufficient for containing the desired set of filaments.

The new tubular metallic container, made of a material analogous to that indicated above, and filled, as stated above, with a set of wires, undergoes a new series of plastic deformation processes, as previously described, until a wire having the desired length and diameter, is obtained.

The wire thus obtained is then wound and the winding of the wire can be a specific winding based on the final application of the product or it can be effected simply for collecting the band.

The filament end-product thus obtained is subsequently subjected to thermal treatment according to one of the following procedures:

c1) after sealing the ends of the wire and winding it according to the typical specifications for superconductive applications, the coil is inserted in a chamber oven, in an atmosphere with a low oxygen content, for example containing Ar, or under vacuum, in order to generate inside and at a high temperature, a pressure of magnesium vapours higher than atmospheric pressure, and it is maintained at a temperature ranging from 700° C. to 950° C. for a time ranging from 15 minutes to three hours, preferably at a temperature ranging from 800° C. to 900° C., for a time ranging from 30 to 120 minutes; or c2) the wire is continuously passed in an upward direction in a non-horizontal tubular oven in an atmosphere of an inert gas or protected from the oxidative attack of air, with a movement rate of the wire and the maximum temperature of the oven which are such as to locally produce on the wire the thermal conditions and treatment times described above under point c1). The oven is placed in a non-horizontal position so that the passage of the wire inside takes place in an upward direction.

Furthermore, the subsequent rewinding of the wire, after baking, must be effected around a support, for example a reel, having a suitable curvature radius, i.e. higher than the mechanical damage limit of the hollow superconductor $MgB_2$ filament.

The preparation of superconductor wires based on hollow filaments of $MgB_2$, according to the method of the present invention, is better illustrated in the following examples which however are non-limiting.

EXAMPLE 1

A composite billet was assembled as follows: a cylindrical solid pure magnesium (99%) central core having a diameter of 6.3 mm, was coaxially inserted in a soft steel tube (ST37.4 of Pessina Tubi, Milan) (having diameters of 12(e)/10(i) mm), internally lined with a sheath of Nb sheets (Wah Chang, USA) for an overall thickness of 0.3 mm. Amorphous boron powder having a purity higher than 98% (amorphous: grade 1, Starck H.C., Germany) having an average particle-size lower than 10 micrometers, said powder having been pressed until a weight ratio Mg/B=1.55 is reached, was inserted in the interspace between the niobium sheath and central magnesium core.

The billet was then swaged until an external diameter of 3.66 mm was obtained, the soft steel was then removed from its surface with acid treatment based on an aqueous solution of $HNO_{3+}HCl$, preventing contamination of the internal products by sealing the ends with a thermosetting resin. The wire-rod thus obtained was divided into seven parts which were inserted, according to a hexagonal arrangement, into a soft steel tube identical to the previous one. This new tube was swaged until a composite filament with an external diameter of 2.5 mm, was obtained.

A sample having a length of 11 cm was taken from the composite wire thus obtained, its ends were sealed with the TIG (Tungsten Inert Gas) technique, and it was baked in an oven, in an inert atmosphere of Ar, at 850° C. for 30 minutes.

The baked sample became superconductive, with an average useful section of $MgB_2$ superconductor material of 1 $mm^2$, which surrounds 7 cavities, in a pseudo-hexagonal arrangement, as illustrated in the micrograph of FIG. 1. FIG. 1 is an optical micrograph of the section of superconductor wire under an optical microscope. A part of the wire, having a length of about 6 cm, was removed to control its superconductor characteristics, by immerging it in a cryostat cooled to a temperature of 4.2 K, after connecting it to a stabilized electric current feed, in the presence of a magnetic field.

Figure 2:
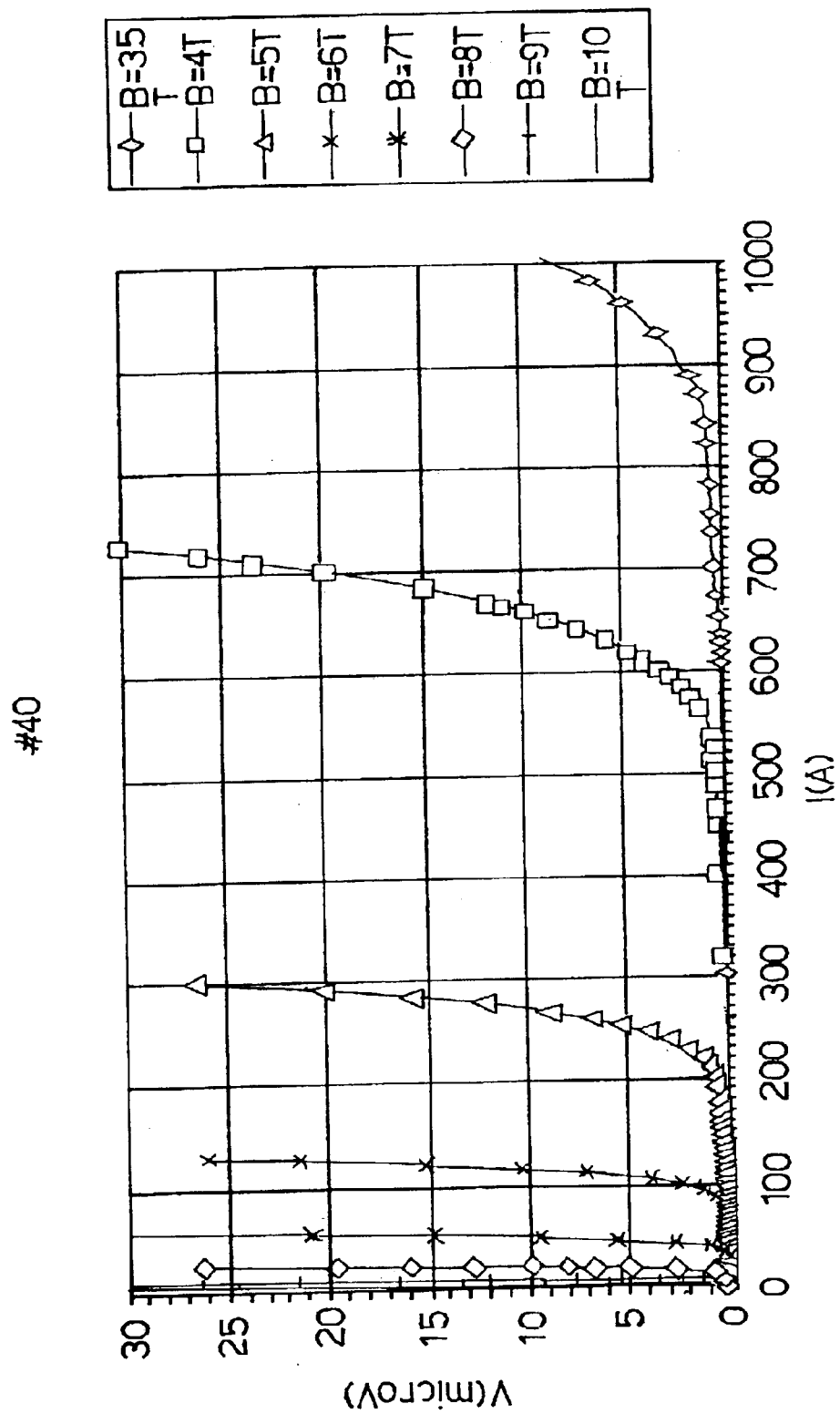

It was thus verified that the superconductor end-product has zero voltage values until a critical current value is reached, depending on the intensity of the magnetic field applied, as can be seen in the graph of FIG. 2. The graph of FIG. 2 represents the trend of the voltage measured between two points at a distance of 1.1 cm, for the end-product of Example 1, when it is fed by an electric current, in the presence of an external magnetic field B for some values ranging from 3.5T to 10T.

Table 1 below indicates the values of the critical current density, in relation to the magnetic field applied, measured assuming the criterion that the electric field does not exceed the threshold of 1 microV/cm and evaluated with respect to the area of the superconductor material.

TABLE 1

Trend of the critical current density of the superconductor end-product of Example 1, in relation to the magnetic field applied.

| Magnetic field (T) | 3.5 | 4 | 5 | 6 | 7 | 8 | 9 | 10 |
|---|---|---|---|---|---|---|---|---|
| Current density (A/mm²) | 872 | 563 | 218 | 92 | 41 | 17 | 7.5 | 3 |

Figure 3:
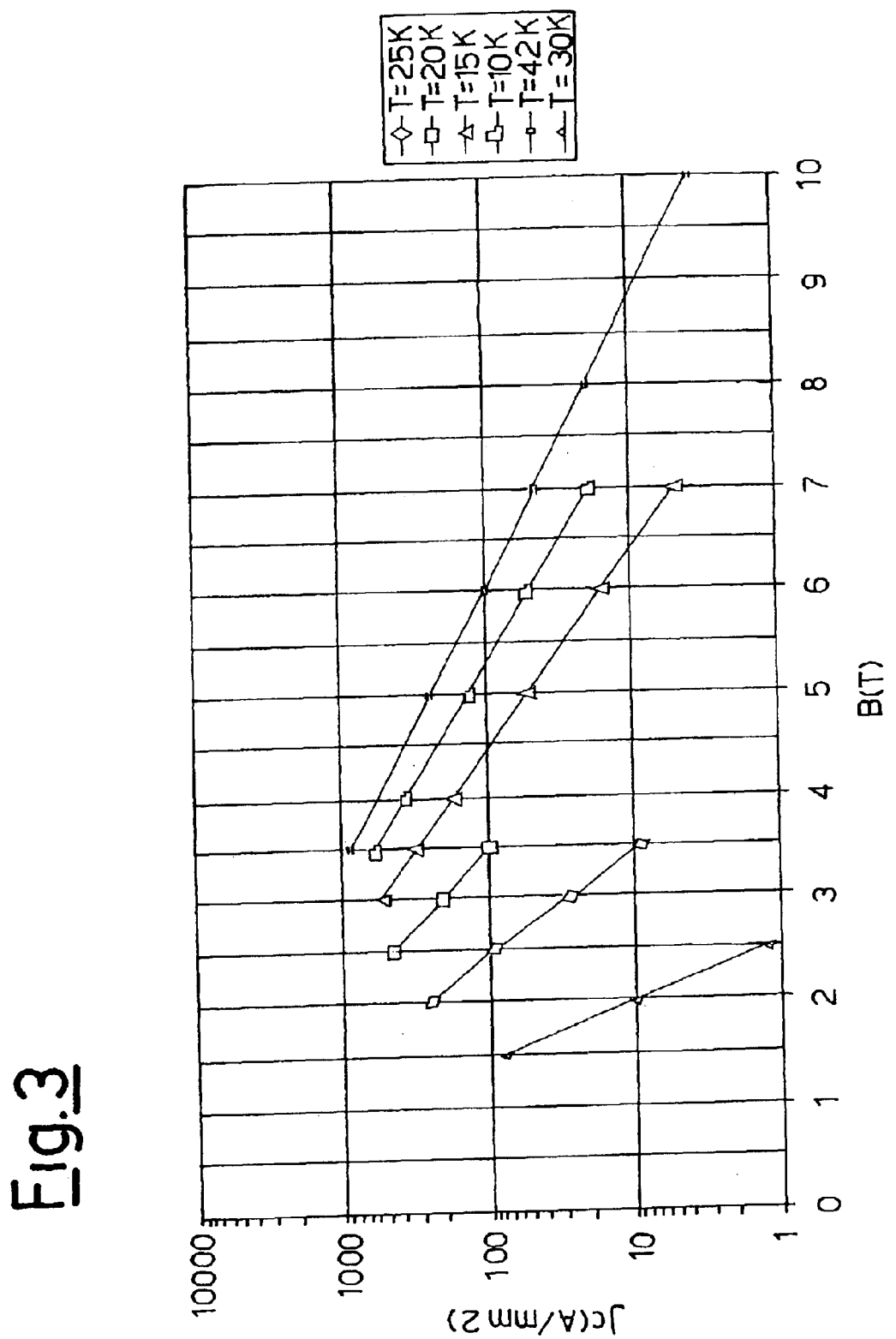

These transport measurements of the critical current density were effected on the same sample, also at different temperatures within the range of 4.2 K to 30 K, obtaining the values indicated in the graph of FIG. 3 and linearly interpolated on a semi-logarithmic scale.

The graph of FIG. 3, in fact, indicates the trend of the critical current density, measured by transport method at different temperatures and applying different magnetic fields, for the end-product of Example 1.

EXAMPLE 2

A composite billet was assembled, consisting of a soft steel tube (ST37.4, Pessina Tubi) having diameters of (20 (e)/15(i)mm), in which an Nb tube (Wah Chang) having diameters of (15(e), 13.2(i)mm) was inserted. A solid magnesium cylindrical bar having a diameter of 9.5 mm was placed inside and at the center of the niobium tube, and an amorphous boron powder, grade 1 (Starck) was inserted, having an average particle-size lower than 10 micrometers, pressed as in Example 1, until a weight ratio Mg/B equal to 1.55 was reached.

The billet is swaged until an external diameter of 2.6 mm was reached, and then drawn until an external diameter of 1.5 mm was obtained. A part of the wire-rod obtained is inserted in a new cylindrical container made of the same soft steel described above, having diameters of (4(e)/2(i)mm), and drawn until an external diameter of 2.2 mm is reached.

A part of the monofilament thus obtained, having a length of 9 cm, is removed and, after sealing the ends with Inox steel plugs, it is thermally treated at a temperature of 900° C. for 2 hours in an Ar environment. The section of the superconductor end-product has, on an average, an area of superconductor material of 0.1 $mm^2$, surrounding a single hollow zone, and is reproduced in FIG. 4.

Figure 4:
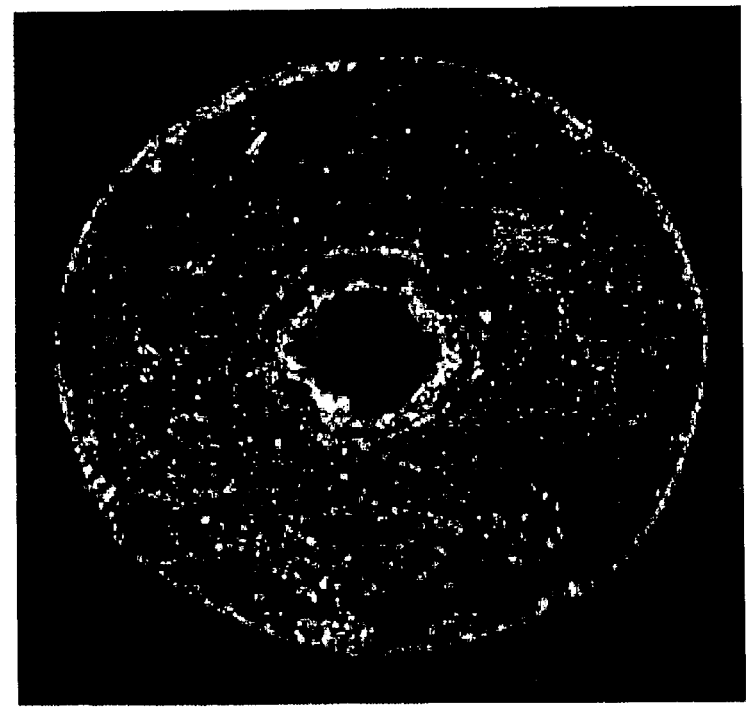

FIG. 4 is an optical micrograph of the section of the superconductor monofilament end-product of Example 2.

The relative results of the critical current density by transport measurements, at various magnetic fields and at a temperature of 4.2 K, according to the procedure and criterion described in Example 1, are indicated in Table 2.

TABLE 2

Trend of the critical current density of the superconductor end-product of Example 2, in relation to the magnetic field applied.

| Magnetic field (T) | 2 | 3 | 4 | 5 | 6 | 7 | 8 |
|---|---|---|---|---|---|---|---|
| Current density (A/$mm^2$) | 5300 | 2400 | 1120 | 500 | 210 | 110 | 58 |

What is claimed is:

1. A method for the production of superconductor wires based on hollow filaments made of $MgB_2$, which comprises:
   a) the formation of a composite billet by means of the coaxial insertion in a tubular metallic container of a cylindrical bar made of metallic magnesium and amorphous boron powder, in the interspace between the container and bar, said powder being pressed between the metallic container and the magnesium bar, in such a quantity that the weight ratio magnesium/boron is higher than 1.2;
   b) at least one plastic deformation treatment of the composite billet thus obtained until a wire with a prefixed diameter is obtained, with the subsequent winding of the wire onto a support;
   c) a thermal treatment of the filament product thus obtained, at a temperature ranging from 700° C. to 950° C. for a time ranging from 15 minutes to three hours.

2. The method according to claim 1, characterized in that, in phase a), a niobium sheath is coaxially inserted, adjacent to the tubular metallic container.

3. The method according to claim 1, characterized in that, in phase b), the plastic deformation treatment of the composite billet thus obtained, is such that series of single deformation passages are alternated with a thermal treatment lasting from 5 to 20 minutes at temperatures ranging from 300° C. to 500° C.

4. The method according to claim 1, characterized in that, for the production of wires based on hollow multifilaments of $MgB_2$, phase a) for the formation of a composite billet comprises the coaxial insertion into a tubular metallic container of a niobium sheath and a cylindrical bar, made of metallic magnesium and, in the interspace between the internal wall of the Nb sheath and the Mg bar, the insertion of amorphous boron powder, said powder being pressed between the metallic container and magnesium bar, in such a quantity that the weight ratio magnesium/boron is higher than 1.2.

5. The method according to claim 1, characterized in that it comprises, after phase b) and before the thermal treatment c), the following phases:
   b1) possible removal by means of chemical or mechanical treatment of the external metallic container of the filament end-product, until the niobium sheath is completely exposed;
   b2) cutting of the filament end-product and its assembly in a further tubular metallic container, with a hexagonal arrangement, of a series of composite wires coming from the cutting process;
   b3) at least one plastic deformation treatment of the tubular container containing the composite multifilaments thus obtained, until a wire with a prefixed diameter is obtained;
   b4) winding of the wire.

6. The method according to claim 5, characterized in that in phase b), the plastic deformation treatment of the composite billet thus obtained, and/or in phase b3), the plastic deformation treatment of the tubular container containing the composite multifilaments thus obtained, is such that series of single deformation passages are alternated with a thermal treatment lasting from 5 to 20 minutes at temperatures ranging from 300° C. to 500° C.

7. The method according to claim 1, characterized in that the thermal treatment c) is effected according to one of the following procedures:
   c1) static thermal treatment in a chamber oven, after sealing the ends of the wire in an atmosphere with a low oxygen content, thus generating inside, at a high temperature, a pressure of magnesium vapours higher than atmospheric pressure; or
   c2) dynamic thermal treatment, by passing the wire continuously through an open tubular oven, containing an atmosphere poor in oxygen.

8. The method according to claim 1, characterized in that the tubular metallic container used in a) consists of several different metallic sheaths.

9. The method according to claim 5, characterized in that phase bi) for the removal of the external metallic container, exposing the Nb sheath, is effected by means of chemical treatment, in particular by means of acid dissolution, or by means of mechanical treatment, in particular by means of abrasion.

10. The method according to any of the previous claims, characterized in that the tubular metallic container consists of steel with a low carbon content, i.e. with a carbon content lower than 0.2% by weight, or Cu or one of its alloys containing Ni, or different layers of the above metals.

11. The method according to any of the claims from 2 to 9, characterized in that the Nb sheath consists of a tube or a sheet rolled up various times, having a total thickness, s, linked to the internal diameter of the metallic container, $d_c$, according to the relation: $0.01*d_c<s<0.05*d_c$.

12. The method according to claim 11, characterized in that the relation between the total thickness, s, of the sheath and the internal diameter of the metallic container, $d_c$, is $0.020*d_c<s<0.035*d_c$.

13. The method according to any of the claims from 1 to 9, characterized in that the metallic magnesium bar is a cylindrical solid pure magnesium bar (<99%), with a diameter, $d_{Mg}$, within the range: $0.5*(d_c-2s)<d_{Mg}<0.8*(d_c-2s)$.

14. The method according to claim 13, characterized in that the diameter, $d_{Mg}$, is within the range of $0.6*(d_c-2s)<d_{Mg}<0.7*(d_c-2s)$.

15. The method according to any of the claims from 1 to 9, characterized in that the non-crystalline boron powder has a purity $\geq 95\%$ (excluding the possible presence of metallic Mg) and a particle-size with an average diameter of less than 20 micrometers.

16. The method according to claim 15, characterized in that the particle-size of the boron powder is less than 10 micrometers.

17. The method according to any of the claims from 1 to 9, characterized in that the quantity of boron powder inserted in the interspace is at least that corresponding to a vertical gravitational filling, assisted by vibrations and manual pressure applied with a tube which can be inserted in the interspace, with a final weight ratio between Mg and B ranging from 1.20 to 1.60.

18. The method according to any of the claims from 1 to 9, characterized in that the plastic deformation treatment is selected from extrusion, drawing, swaging or rolling.

19. The method according to claim 9, characterized in that phase b1) for the removal of the external metallic container by means of acid dissolution, is effected by means of chemical treatment with the mixture $HCl/HNO_3$ (50/50), protecting the heads of the filament end-product from acid attack.

20. The method according to claim 5, characterized in that, in phase b2), the cutting of the filament end-product consisting of the Nb sheath including Mg and B contemplates a subdivision into parts having a suitable length, the assembly in a hexagonal arrangement of a series of wires which homogeneously fill a new tubular metallic container, having an internal diameter sufficient for containing a set of wires.

21. The method according to claim 7, characterized in that the thermal treatment c1) comprises, once the ends of the wire have been sealed and the wire wound according to the specifications for superconductive applications, the insertion of the coil in a chamber oven, in an atmosphere with a low oxygen content, or under vacuum, at a temperature ranging from 700° C. to 950° C. for a time ranging from 15 minutes to three hours.

22. The method according to claim 7, characterized in that the thermal treatment c2) comprises the passage of the wire in an upward direction in a non-horizontal tubular oven in an atmosphere of an inert gas or protected from the oxidative attack of air, with a movement rate of the wire and a maximum temperature of the oven which are such as to locally create on the wire a temperature ranging from 700° C. to 950° C. and for a time ranging from 15 minutes to three hours.

23. The method according to claims 21 or 22, characterized in that the temperature ranges from 800° C. to 900° C. and the time ranges from 30 to 120 minutes.

* * * * *